(12) United States Patent
Wang et al.

(10) Patent No.: US 6,849,543 B2
(45) Date of Patent: Feb. 1, 2005

(54) COBALT SILICIDE FORMATION METHOD EMPLOYING WET CHEMICAL SILICON SUBSTRATE OXIDATION

(75) Inventors: Mei-Yun Wang, Hsin-Chu (TW);
Chih-Wei Chang, Hsin-Chu (TW);
Shau-Lin Shue, Hsin chu (TW);
Ching-Hau Hsieh, Hsin chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/269,283

(22) Filed: Oct. 12, 2002

(65) Prior Publication Data

US 2004/0087144 A1 May 6, 2004

(51) Int. Cl.$^7$ ............... H01L 21/4763; H01L 21/44; H01L 21/302; H01L 21/461
(52) U.S. Cl. ............... 438/649; 438/682; 438/755
(58) Field of Search ............... 438/649, 682, 438/755

(56) References Cited

U.S. PATENT DOCUMENTS

| | | | |
|---|---|---|---|
| 5,728,625 A | * 3/1998 | Tung | 438/586 |
| 5,780,362 A | 7/1998 | Wang et al. | 438/683 |
| 6,197,646 B1 | 3/2001 | Goto et al. | 438/301 |
| 2002/0142616 A1 | * 10/2002 | Giewont et al. | 438/745 |

OTHER PUBLICATIONS

Chang et al, ULSI Technology, McGraw–Hill, 1996, pp. 397–402.

Wang et al, "New CoSi$_2$ Salicide Technology for 0.1 μm Process and Below", 1995 Symposium on VLSI Technology Digest of Technical Papers, pp. 17–18.

Tung et al, "Increased Uniformity and Thermal Stability of CoSi$_2$ Thin Films by Ti Capping", Appl. Phys. Lett., 67 (15), Oct. 9, 1995, pp. 2164–2166.

Sohn et al, "High Thermal Stability and Low Junction Leakage Current of Ti Capped Co Salicide and ... Devices", IEDM 98–1005 to 98–1008.

* cited by examiner

Primary Examiner—William M. Brewster
(74) Attorney, Agent, or Firm—Tung & Associates

(57) ABSTRACT

A method for forming a cobalt silicide layer employs a sequential treatment of a silicon substrate with a hydrofluoric acid material followed by a wet chemical oxidant material. A cobalt material layer is then formed upon the sequentially treated silicon substrate and the silicon substrate/cobalt material layer laminate is thermally annealed to form a cobalt silicide layer. Use of the wet chemical oxidant material for treating the silicon substrate provides the cobalt silicide layer with enhanced electrical properties.

15 Claims, 2 Drawing Sheets

COBALT SILICIDE FORMATION METHOD EMPLOYING WET CHEMICAL SILICON SUBSTRATE OXIDATION

BACKGROUND OF THE INVENTION

1. Field of the Invention

The present invention relates generally to methods for fabricating microelectronic products. More particularly, the present invention relates to methods for forming cobalt silicide layers within microelectronic products.

2. Description of the Related Art

Common in the art of microelectronic product fabrication, and particularly in the art of semiconductor product fabrication, is the use of silicide layers. Silicide layers are desirable within microelectronic products since silicide layers generally provide low contact resistance layers within microelectronic products.

Of the types of silicide layers which may be formed within microelectronic products cobalt silicide layers are particularly desirable insofar as cobalt silicide layers generally provide low contact resistance even as contact areas diminish.

While cobalt silicide layers are thus desirable in the art of microelectronic product fabrication, cobalt silicide layers are nonetheless not entirely without problems in the art of microelectronic product fabrication. In that regard, cobalt silicide layers are often difficult to fabricate with enhanced electrical properties within microelectronic products.

It is thus desirable in the art of microelectronic fabrication to fabricate cobalt silicide layers with enhanced electrical properties.

It is towards the foregoing object that the present invention is directed.

Various methods have been disclosed in the art of microelectronic product fabrication for forming cobalt silicide layers with desirable properties.

Included among the methods, but not limiting among the methods, are methods disclosed within: (1) Wang et al., in "New CoSi2 SALICIDE Technology for 0.1 um Processes and Below," 1995 Symposium on VLSI Technology Digest of Technical Papers, pp. 17–18; (2) Tung et al., in "Increased uniformity and thermal stability of CoSi2 thin films by Ti capping," Appl. Phys. Lett., 67 (15), 9 Oct. 1995, pp. 2164–66; (3) Sohn et al., in "High Thermal Stability and Low Junction Leakage Current of Ti Capped Co Salicide and its Feasibility for High Thermal Budget CMOS Devices," IEDM 98–1005 to 98–1008; (4) Wang et al., in U.S. Pat. No. 5,780,362; and (5) Goto et al., in U.S. Pat. No. 6,197,646, all of which relate at least in part to capping layer methods for forming cobalt silicide layers. The teachings of all of the foregoing references are incorporated herein fully by reference.

Desirable in the art of microelectronic product fabrication are additional methods for fabricating cobalt silicide layers with enhanced electrical properties.

It is towards the foregoing object that the present invention is directed.

SUMMARY OF THE INVENTION

A first object of the present invention is to provide a method for forming a cobalt silicide layer within a microelectronic product.

A second object of the invention is to provide a method in accord with the first object of the invention, wherein cobalt silicide layer is formed with enhanced electrical properties.

In accord with the objects of the invention, the invention provides a method for forming a cobalt silicide layer.

To practice the method, there is first provided a silicon substrate. There is then treated the silicon substrate with a hydrofluoric acid material to provide a bare silicon substrate. There is then treated the bare silicon substrate with a wet chemical oxidant to provide a wet chemical oxidant treated silicon substrate. There is then formed upon the wet chemical oxidant treated silicon substrate a cobalt material layer. Finally, there is then thermally annealed the wet chemical oxidant treated silicon substrate having formed thereupon the cobalt material layer to form therefrom a cobalt silicide layer upon a thermally annealed silicon substrate.

The present invention provides a method for forming a cobalt silicide layer within a microelectronic product, wherein cobalt silicide layer is formed with enhanced electrical properties.

The present invention realizes the foregoing object within the context of a thermal annealing method for forming a cobalt silicide layer from a silicon substrate/cobalt material layer laminate by sequentially treating the silicon substrate with a hydrofluoric acid material and a wet chemical oxidant material prior to forming thereupon the cobalt material layer and annealing the laminate to form a cobalt silicide layer upon a thermally annealed silicon substrate.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a cobalt silicide layer within a microelectronic product, wherein the cobalt silicide layer is formed with enhanced properties.

The present invention realizes the foregoing object within the context of a thermal annealing method for forming a cobalt silicide layer from a silicon substrate/cobalt material layer laminate by sequentially treating the silicon substrate with a hydrofluoric acid material and a wet chemical oxidant material prior to forming thereupon the cobalt material layer and annealing the laminate to form a cobalt silicide layer upon a thermally annealed silicon substrate.

While the preferred embodiment of the invention illustrates the invention within the context of forming a cobalt silicide layer upon a planar silicon substrate ostensibly formed of a single silicon material, the present invention is not intended to be so limited. Rather, the present invention may be employed for fabricating cobalt silicide layers upon planar substrates and non-planar substrates while employing self-aligned and non self-aligned methods. More particularly, the present invention may be employed for forming cobalt silicide layers in a self-aligned fashion simultaneously upon polysilicon gate electrodes and monocrystalline silicon source/drain regions within field effect transistor devices. Such an application of the invention is illustrated in greater detail within the references cited within the Description of the Related Art, and in particular within Wang et al., where the teachings of all of the Related Art are incorporated herein fully by reference.

Figure 1:
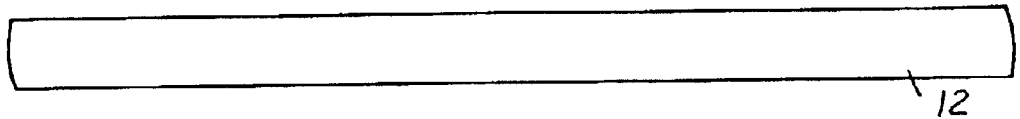
FIG. 1, FIG. 2, FIG. 3, FIG. 4 and FIG. 5 show a series of schematic cross-sectional diagrams illustrating the results of progressive stages of forming a cobalt silicide layer in accord with a preferred embodiment of the invention.

FIG. 1 to FIG. 5 show a series of schematic cross-sectional diagrams illustrating the results of progressive stages of forming a cobalt silicide layer within a microelectronic product in accord with a preferred embodiment of the invention. FIG. 1 shows a schematic cross-sectional diagram of the microelectronic product at an early stage in its fabrication in accord with the preferred embodiment of the invention.

FIG. 1 shows a silicon substrate 12.

Within the invention, the silicon substrate 12 may be formed from a silicon material selected from the group including but not limited to amorphous silicon materials, monocrystalline silicon materials and polycrystalline silicon materials. As indicated above, the silicon substrate 12 may comprise separate locations of separated silicon materials, such as amorphous silicon materials, monocrystalline silicon materials and polycrystalline silicon materials. Alternatively, the silicon substrate 12 may consist of a single region of an amorphous silicon material, a monocrystalline silicon material or a polycrystalline silicon material. The silicon substrate 12 may also comprise additional microelectronic layers, such as conductor layers, semiconductor layers and dielectric layers, provided that a surface of the silicon substrate 12 is formed at least in part of a silicon material.

Figure 2:
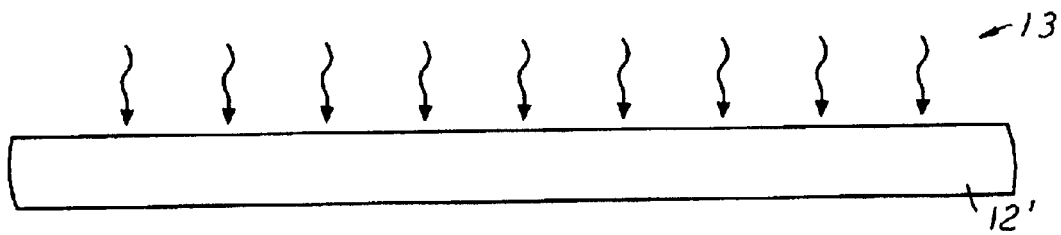

FIG. 2 shows the results of further processing of the microelectronic product of FIG. 1.

FIG. 2 shows the results of treating the silicon substrate 12 with a hydrofluoric acid material treatment 13 to form therefrom a bare silicon substrate 12'.

Within the invention, the hydrofluoric acid material may be selected from the group including but not limited to anhydrous hydrofluoric acid, aqueous hydrofluoric acid (i.e. 49 weight percent hydrofluoric acid in water), dilute aqueous hydrofluoric acid (in a hydrofluoric acid:water dilution range of from about 1:5 to about 1:1000 and buffered hydrofluoric acid (i.e. aqueous hydrofluoric acid/aqueous ammonium fluoride mixtures) of similar dilutions. Within the invention, the silicon substrate 12 is typically treated with dilute aqueous hydrofluoric acid in a dilution range of from about 1:50 to about 1:100 for a time period of from about 5 to about $10^3$ seconds.

As is understood by a person skilled in the art, the hydrofluoric acid material treatment 13 is intended to remove from the silicon substrate 12 as illustrated in FIG. 1 impurities and native silicon oxide surface materials when forming therefrom the bare silicon substrate 12' as illustrated within FIG. 2.

Figure 3:
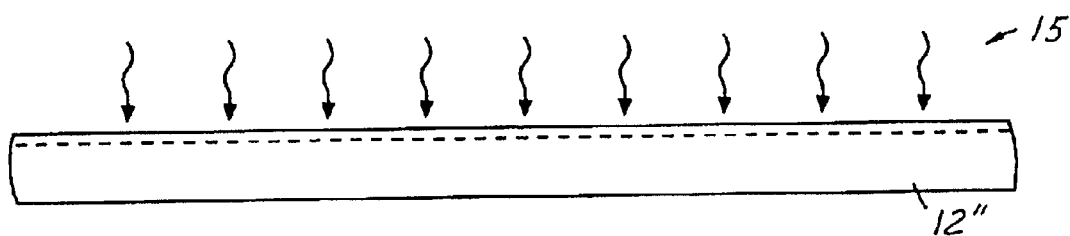

FIG. 3 illustrates the results of further processing of the microelectronic product of FIG. 2.

FIG. 3 illustrates the results of treating the bare silicon substrate 12' with a wet chemical oxidant material treatment 15 to form therefrom a wet chemical oxidant treated silicon substrate 12". Within the invention, there is not employed a thermal oxidation method (i.e., a generally higher temperature (800–1000 degrees centigrade) method) for thermally oxidizing the bare silicon substrate 12'.

Within the invention, the wet chemical oxidant material may be an aqueous wet chemical oxidant material selected from the group including but not limited to aqueous solutions of ammonia (i.e. ammonium hydroxide), nitric acid, sulfuric acid, hydrogen peroxide, ozone, hydrochloride acid and mixtures thereof. More preferably, the wet chemical oxidant is an aqueous hydrogen peroxide with ammonia oxidant at a concentration of from about 1:1 to about 1:500 weight percent, with a treatment time of from about 1 to about $10^2$ minutes and a treatment temperature of from about 30 to about 70 degrees centigrade. Within the invention, the wet chemical oxidant treatment 15 may also employ non-aqueous solvents, such as non-aqueous alcohol solvents.

While not being bound to any particular theory of operation of the invention, it is believed that the wet chemical oxidant treatment 15 provides a generally porous silicon oxide surface layer upon the wet chemical oxidant treated silicon substrate 12". In comparison, a thermal oxidation treatment would provide a considerably denser silicon oxide surface layer.

Figure 4:
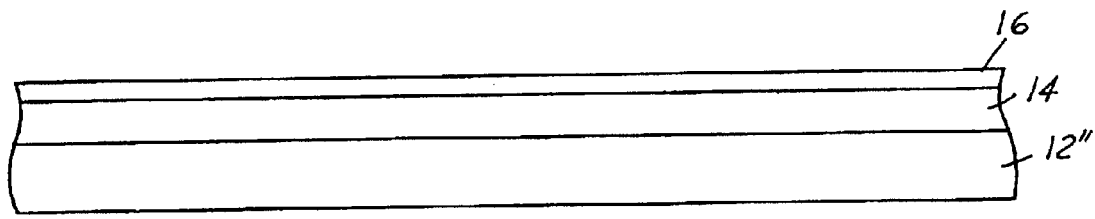

FIG. 4 shows the results of further processing of the microelectronic product of FIG. 3.

FIG. 4 shows the results of forming a cobalt material layer 14 upon the wet chemical oxidant treated silicon substrate 12". FIG. 4 also shows the results of forming a capping layer 16 upon the cobalt material layer 14. Within the invention, the capping layer may be optional, but is generally preferred such as to provide superior results.

Within the invention, the cobalt material layer 14 may be formed of cobalt metal or a cobalt metal alloy which comprises other silicide forming metals. Typically the cobalt material layer 14 consists of or consists essentially of cobalt metal formed to a thickness of from about 10 to about 500 angstroms.

Within the invention, the capping layer 18 may be formed of capping materials as are conventional in the art of silicidation processing within microelectronic product fabrication. Such capping materials may include, but not limited to titanium capping materials, tungsten capping materials, as well as nitrides thereof. Typically, the capping layer 16 is formed to a thickness of from about 10 to about 500 angstroms.

Figure 5:
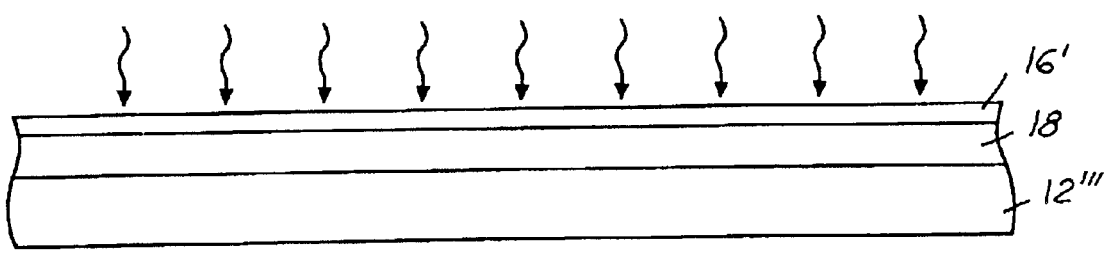

FIG. 5 shows the results of further processing of the microelectronic product of FIG. 4.

FIG. 5 shows the results of thermally annealing the microelectronic product of FIG. 4 to form a partially consumed thermally annealed silicon substrate 12''' having formed thereupon a cobalt silicide layer 18 in turn having formed thereupon a thermally annealed capping layer 16'.

Within the invention, the microelectronic product of FIG. 4 is thermally annealed to form the microelectronic product of FIG. 5 incident to thermal annealing at a temperature of from about 400 to about 650 degrees centigrade for a time period of from about 10 to about 200 seconds, and generally within a nitrogen thermal annealing atmosphere. Within the context of such thermal annealing conditions on top of a selective wet etch process and a second RTA process, the cobalt silicide layer 18 is generally formed to a thickness from about 100 to about 1000 angstroms.

FIG. 5 illustrates a microelectronic product fabricated in accord with the present invention. The microelectronic product has formed therein a cobalt silicide layer formed with enhanced electrical properties insofar as the cobalt silicide layer is formed upon a silicon substrate which has been treated with a hydrofluoric acid material followed by a wet chemical oxidant material.

EXAMPLES

Three (100) silicon semiconductor substrates were surface treated while employing three separate surface treatment methods. A first silicon semiconductor substrate was treated with a 1:100 dilute aqueous hydrofluoric solution at a temperature of about 25 degrees centigrade for a time period of about 30 seconds. A second silicon semiconductor substrate was treated with the same dilute aqueous hydrofluoric acid treatment as the first semiconductor substrate, but followed by a thermal oxidation treatment at a temperature of about 700 degrees centigrade for a time period of about 5 minutes to form a thermal silicon oxide layer of thickness about 20 angstroms. A third silicon semiconductor substrate was treated with the same dilute aqueous hydrofluoric acid treatment followed by a wet chemical oxidant treatment with an aqueous hydrogen peroxide wit ammonia oxidant at a concentration of about 5 weight percent, a temperature of about 50 degrees centigrade and a time period of about 6 minutes to form a silicon oxide layer of thickness about 10 angstroms.

Cobalt layers of thickness about 130 angstroms were then formed upon each of the above three fully treated semiconductor substrates. In turn, titanium capping layers of thickness about 80 angstroms were formed upon each of the cobalt layers.

The treated and cobalt/titanium layered semiconductor substrates were then thermally annealed at a temperature of about 500 degrees centigrade for a time period of about 2 minutes within a nitrogen atmosphere to form a series of cobalt silicide layers upon the series of thermally annealed silicon semiconductor substrates. A selective wet etch process and a second 800° C. 2 minute annealing process are then carried out.

Sheet resistances and junction leakages of the series of three cobalt silicide layers were then determined employing methods as are conventional in the art.

Figure 6:
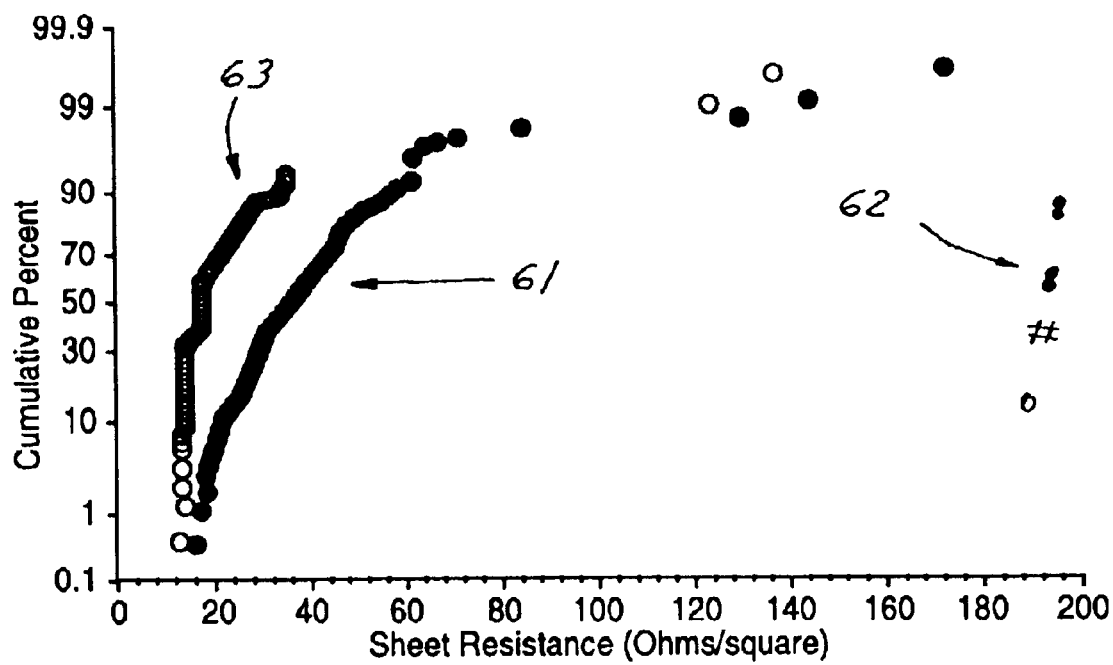
FIG. 6 shows a graph of Commutative Percent versus Sheet Resistance for cobalt silicide layers formed in accord with the invention and not in accord with the invention.

Results of sheet resistance measurements are illustrated in FIG. 6, which shows a graph of Commutative Percent versus Sheet Resistance. Within FIG. 6, the sets of data points which correspond with reference numerals 61, 62 and 63 correspond with sheet resistances for the cobalt silicide layers formed upon the first, second and third semiconductor substrates.

Figure 7:
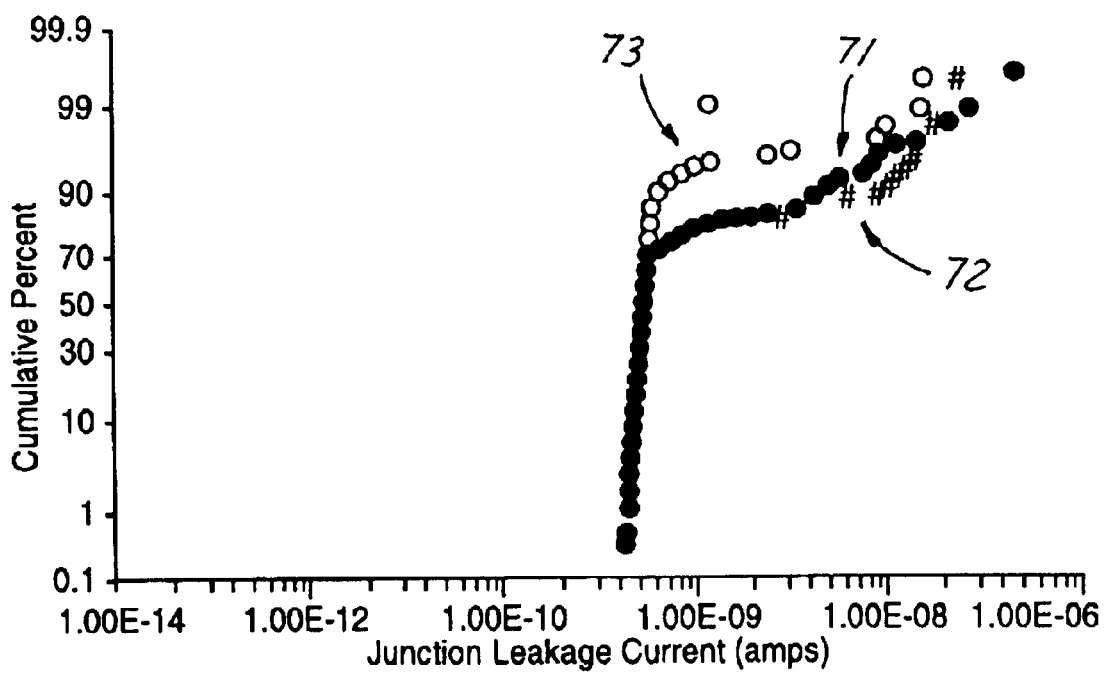
FIG. 7 shows a graph of Commutative Percent versus Junction Leakage Current for cobalt silicide layers formed in accord with the invention and not in accord with the invention.

Results of junction leakage current measurements are illustrated in FIG. 7, which shows a graph of Commutative Percent versus Junction Leakage Current. Within FIG. 7, the sets of data points which correspond with reference numerals 71, 72 and 73 correspond with junction leakage currents for the cobalt silicide layers formed upon the first, second and third semiconductor substrates.

As is seen from review of the data in FIG. 6 and FIG. 7, cobalt silicide layers formed employing a silicon substrate wet chemical oxidation treatment in accord with the present invention provide cobalt silicide layers with superior contact resistance properties (i.e., lower contact resistances) and junction leakage properties (i.e., lower junction leakage currents).

As is understood by a person skilled in the art, the preferred embodiment and examples of the invention are illustrative of the invention rather than limiting of the invention. Revisions and modifications may be made to methods, materials, structures and dimensions in accord with the preferred embodiment and examples of the invention while still providing embodiments and examples of the present invention, further in accord with the accompanying claims.

What is claimed is:

1. A method for forming a cobalt suicide layer comprising:

providing a silicon substrate;

treating the silicon substrate with a hydrofluoric acid material to provide a bare silicon substrate;

treating the bare silicon substrate with a wet chemical oxidant material, without employing a thermal oxidation of the bare silicon substrate, to provide a wet chemical oxidant treated silicon substrate having a silicon oxide layer formed thereupon;

forming upon the wet chemical oxidant treated silicon substrate including the silicon oxide layer a cobalt material layer, and thermally annealing the wet chemical oxidant treated silicon substrate having formed thereupon the cobalt material layer to form a cobalt silicide layer upon a thermally annealed silicon substrate.

2. The method of claim 1 wherein the silicon substrate is a monocrystalline silicon substrate.

3. The method of claim 1 wherein the silicon substrate is a polycrystalline silicon substrate.

4. The method of claim 1 wherein the wet chemical oxidant is selected from the group consisting of aqueous solutions of nitric acid, sulfuric acid, ozone and mixtures thereof.

5. The method of claim 1 wherein the cobalt material layer is formed from cobalt.

6. The method of claim 1 wherein the cobalt material layer is formed of a cobalt alloy of a suicide forming metal.

7. The method of claim 1 wherein the wet chemical oxidant material comprises an aqueous solution of ammonia and hydrogen peroxide.

8. A method for forming a cobalt suicide layer comprising:
- providing a silicon substrate;
- treating the silicon substrate with a hydrofluoric acid material to provide a bare silicon substrate;
- treating the bare silicon substrate with a wet chemical oxidant material, without employing a thermal oxidation of the bare silicon substrate, to provide a wet chemical oxidant treated silicon substrate having a silicon oxide layer formed thereupon;
- forming upon the wet chemical oxidant treated silicon substrate including the silicon oxide layer a cobalt material layer;
- forming upon the cobalt material layer a capping layer; and
- thermally annealing the wet chemical oxidant treated silicon substrate having formed thereupon the cobalt material layer and thereover the capping layer to form a cobalt silicide layer upon a thermally annealed silicon substrate.

9. The method of claim 8 wherein the silicon substrate is a monocrystalline silicon substrate.

10. The method of claim 8 wherein the silicon substrate is a polycrystalline silicon substrate.

11. The method of claim 8 wherein the wet chemical oxidant is selected from the group consisting of aqueous solutions of nitric acid, sulfuric acid, ozone and mixtures thereof.

12. The method of claim 8 wherein the cobalt material layer is formed from cobalt.

13. The method of claim 8 wherein the cobalt material layer is formed of a cobalt alloy of a suicide forming metal.

14. The method of claim 8 wherein the capping layer is formed from a material selected from the group consisting of titanium, tungsten and nituides thereof.

15. The method of claim 8 wherein the wet chemical oxidant material comprises an aqueous solution of ammonia and hydrogen peroxide.

* * * * *